US008665129B2

(12) United States Patent
Dosho

(10) Patent No.: US 8,665,129 B2
(45) Date of Patent: Mar. 4, 2014

(54) COMPLEX SECOND-ORDER INTEGRATOR AND OVERSAMPLING A/D CONVERTER HAVING THE SAME

(75) Inventor: Shiro Dosho, Osaka (JP)

(73) Assignee: Panasonic Corporation, Osaka (JP)

( * ) Notice: Subject to any disclaimer, the term of this patent is extended or adjusted under 35 U.S.C. 154(b) by 201 days.

(21) Appl. No.: 13/410,991

(22) Filed: Mar. 2, 2012

(65) Prior Publication Data

US 2012/0161999 A1 Jun. 28, 2012

Related U.S. Application Data

(63) Continuation of application No. PCT/JP2010/004390, filed on Jul. 5, 2010.

(30) Foreign Application Priority Data

Sep. 29, 2009 (JP) ................................. 2009-225133

(51) Int. Cl.
 *H03M 3/00* (2006.01)
(52) U.S. Cl.
 USPC .......................................... 341/143; 341/155
(58) Field of Classification Search
 USPC ................... 341/143, 155, 156, 158, 172, 110
 See application file for complete search history.

(56) References Cited

U.S. PATENT DOCUMENTS

| 4,914,408 A | 4/1990 | Voorman |
| 4,984,292 A | 1/1991 | Millen |
| 6,148,048 A | 11/2000 | Kerth et al. |
| 2007/0236375 A1 | 10/2007 | Andre |
| 2011/0050476 A1 | 3/2011 | Dosho et al. |
| 2011/0169676 A1* | 7/2011 | Iriguchi ........................ 341/143 |

FOREIGN PATENT DOCUMENTS

| JP | 53-024252 | 3/1978 |
| JP | 59-141826 | 8/1984 |
| JP | 07-231258 | 8/1995 |
| JP | 2009-124507 | 6/2009 |

OTHER PUBLICATIONS

International Search Report issued in International Patent Application No. PCT/JP2010/004390 dated Aug. 10, 2010.
J. Crols et al., "An Analog Integrated Polyphase Filter for a High Performance Low-IF Receiver," 1995 Symposium on VLSI Circuits Digest of Technical Papers.

* cited by examiner

*Primary Examiner* — Joseph Lauture
(74) *Attorney, Agent, or Firm* — McDermott Will & Emery LLP

(57) ABSTRACT

An oversampling A/D converter with a few operational amplifiers is configured using a complex second-order integrator including first and second second-order integrators and first and second coupling circuits configured to couple these integrators together. Each of the second-order integrators includes an operational amplifier, four resistance elements, and three capacitance elements. The first coupling circuit cross-couples one of two serially-connected capacitance elements inserted between the inverted input terminal and output terminal of the operational amplifier in the first second-order integrator to the counterpart in the second second-order integrator using two resistance elements. The second coupling circuit cross-couples the other capacitance element in the first second-order integrator to the counterpart in the second second-order integrator using two resistance elements.

8 Claims, 4 Drawing Sheets

COMPLEX SECOND-ORDER INTEGRATOR AND OVERSAMPLING A/D CONVERTER HAVING THE SAME

CROSS-REFERENCE TO RELATED APPLICATION

This is a continuation of PCT International Application PCT/JP2010/004390 filed on Jul. 5, 2010, which claims priority to Japanese Patent Application No. 2009-225133 filed on Sep. 29, 2009. The disclosures of these applications including the specifications, the drawings, and the claims are hereby incorporated by reference in their entirety.

BACKGROUND

The present disclosure relates to a complex second-order integrator, and more particularly to a complex second-order integrator suitable for a continuous-time $\Delta\Sigma$ modulator, etc.

Oversampling A/D conversion, which is in widespread use in the front-end of communications equipment, conversion of audio signals, etc., is a circuitry technology essential for the current communications, video, and audio signal processing circuits. One type of oversampling A/D converters is a continuous-time delta-sigma ($\Delta\Sigma$) A/D converter (CTDS-ADC) having a continuous-time filter.

In a general CTDS-ADC, an input signal passes through n-cascaded integrators (continuous-time filters) and the signal is quantized by a quantizer. The digital output of the quantizer is fed back to the n integrators after being converted to an analog current signal by n D/A converters. In the CTDS-ADC, having no switch in its analog circuit portion, the voltage can be reduced. Also, it is unnecessary to place a prefilter that is normally necessary when a sampling filter is used. Having these features, the CTDS-ADC is suitable for applications to communications systems, and thus recently application development and research have been actively conducted.

In communications equipment, etc., a complex filter is often used for removal of an image signal. A typical complex filter has a configuration where integrators respectively receiving I signal and Q signal displaced 90° in phase from each other are coupled together with a coupling circuit (see U.S. Pat. No. 4,914,408, for example). While a coupling circuit is generally formed of active elements such as transistors, a coupling circuit that couples first-order integrators together can be formed of passive elements, specifically resistance elements, without use of active elements (see Jan Crols and Michiel Steyaert, "An Analog Integrated Polyphase Filter for a High Performance Low-IF Receiver," Digest of Technical Papers, Symposium on VLSI Circuit, pp. 87-88, 1995, for example).

The inventor of the present disclosure has found the following problems on the conventional CTDS-ADC. In order to improve the resolution and SN performance of the CTDS-ADC, the filter order for removal of quantization noise must be increased, and this necessitates operational amplifiers of the number corresponding to the increased filter order. Moreover, when it is intended to implement a CTDS-ADC provided with a complex coefficient, the number of operational amplifiers must be doubled. As described above, a coupling circuit that couples first-order integrators together can be formed without use of any operational amplifier. However, it is unknown whether a coupling circuit that couples high-order integrators each including one operational amplifier can be formed without use of any active element.

In other words, to improve further the performance of the CTDS-ADC by putting the CTDS-ADC in a complex form, a number of operational amplifiers must be used. However, increase in the number of operational amplifiers will increase the circuit scale and the power consumption, causing a bottleneck in improving the performance of system LSIs applied to mobile communications equipment, etc.

SUMMARY

According to the present disclosure, a complex second-order integrator can be implemented with a reduced number of operational amplifiers. Moreover, according to the present disclosure, a high-order continuous-time oversampling A/D converter having such a complex second-order integrator can be implemented.

The complex second-order integrator of an example of the present disclosure includes: first and second second-order integrators; and first and second coupling circuits configured to couple the first and second second-order integrators together. Each of the first and second second-order integrators includes an operational amplifier, a first resistance element connected between a first node and a signal input terminal of the second-order integrator, a second resistance element connected between the first node and an inverted input terminal of the operational amplifier, a first capacitance element connected between the first node and a ground, a second capacitance element connected between a second node and the inverted input terminal of the operational amplifier, a third capacitance element connected between the second node and an output terminal of the operational amplifier, a third resistance element connected between the second node and the ground, and a fourth resistance element connected between the first node and the ground. The first coupling circuit includes a fifth resistance element configured to couple the output terminal of the operational amplifier of the first second-order integrator to the second node in the second second-order integrator with the polarity mutually inverted, and a sixth resistance element configured to couple the output terminal of the operational amplifier of the second second-order integrator to the second node in the first second-order integrator with no polarity inversion involved. The second coupling circuit includes a seventh resistance element configured to couple the inverted input terminal of the operational amplifier of the second second-order integrator to the second node in the first second-order integrator with the polarity mutually inverted, and an eighth resistance element configured to couple the inverted input terminal of the operational amplifier of the first second-order integrator to the second node in the second second-order integrator with no polarity inversion involved.

With the above configuration, only one operational amplifier is used in each of the first and second second-order integrators, and the first and second coupling circuits are made of resistance elements, i.e., passive elements. Therefore, a complex second-order integrator exhibiting the second-order complex integral characteristic can be implemented with only two operational amplifiers in total.

The complex second-order integrator may further include a third coupling circuit configured to couple the first and second second-order integrators together. Each of the first and second second-order integrators may include a fourth capacitance element connected between the second node and the signal input terminal of the second-order integrator, and a ninth resistance element connected between the second node and the signal input terminal of the second-order integrator. The third coupling circuit may include a tenth resistance element configured to couple the signal input terminal of the first second-order integrator to the second node in the second second-order integrator with the polarity mutually inverted, and an eleventh resistance element configured to couple the signal input terminal of the second second-order integrator to the second node in the first second-order integrator with no polarity inversion involved.

With the above configuration, an arbitrary transfer characteristic represented by $(\alpha(s-\delta)^2+\beta(s-\delta)+\gamma)/(s-\delta)^2$ (where s is a Laplace operator and $\alpha$, $\beta$, $\gamma$, and $\delta$ are constants determined by the values of the elements) can be achieved.

Preferably, an overall admittance where elements connected to the first node are in parallel connection is equal to an overall admittance where elements connected to the second node are in parallel connection. With this configuration, the complex second-order integrator functions as a complex second-order resonator without the necessity of providing a resistive path between the first node and the output terminal of the operational amplifier in each of the first and second second-order integrators.

The oversampling A/D converter of an example of the present disclosure includes at least one complex second-order integrator described above.

DETAILED DESCRIPTION (First Embodiment)

Figure 1:
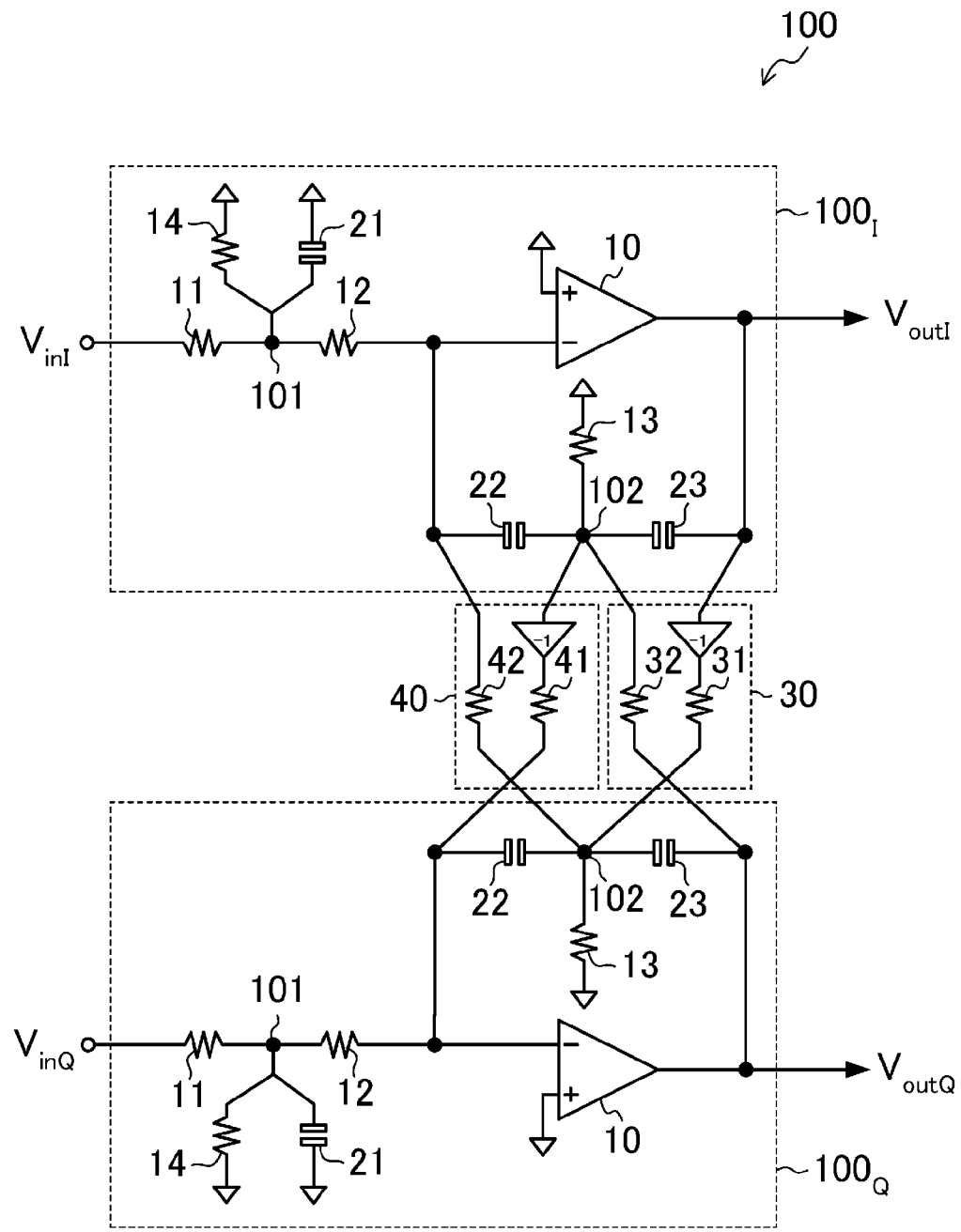
FIG. 1 is a block diagram of a complex second-order integrator of a first embodiment.

FIG. 1 shows a configuration of a complex second-order integrator of the first embodiment. A complex second-order integrator 100 of this embodiment includes: a second-order integrator 100$_I$ that receives a signal $V_{inI}$ and outputs a signal $V_{outI}$; a second-order integrator 100$_Q$ that receives a signal $V_{inQ}$ displaced 90° in phase from the signal $V_{inI}$ and outputs a signal $V_{outQ}$ displaced 90° in phase from the signal $V_{outI}$; and two coupling circuits 30 and 40 that couple the second-order integrators 100$_I$ and 100$_Q$ together.

The second-order integrators 100$_I$ and 100$_Q$ each can be formed using one operational amplifier 10. Specifically, an input-part filter having resistance elements 11, 12, and 14 and a capacitance element 21 is provided between the signal input terminal and the inverted input terminal of the operational amplifier 10. One terminal of each of these elements is connected to a node 101, the other terminals of the resistance elements 11 and 12 are respectively connected to the signal input terminal and the inverted input terminal of the operational amplifier 10, and the other terminals of the resistance element 14 and the capacitance element 21 are grounded. A feedback-part filter having capacitance elements 22 and 23 and a resistance element 13 is provided between the inverted input terminal and output terminal of the operational amplifier 10. One terminal of each of these elements is connected to a node 102, the other terminals of the capacitance elements 22 and 23 are respectively connected to the inverted input terminal and output terminal of the operational amplifier 10, and the other terminal of the resistance element 13 is grounded.

The coupling circuit 30 cross-couples the capacitance elements 23 of the second-order integrators 100$_I$ and 100$_Q$ together. Specifically, the coupling circuit 30 can be formed of resistance elements 31 and 32. The resistance element 31 couples one of the two terminals of the capacitance element 23 of the second-order integrator 100$_I$ that is connected to the output terminal of the operational amplifier 10 to one of the two terminals of the capacitance element 23 of the second-order integrator 100$_Q$ that is connected to the node 102 with the polarity mutually inverted. The resistance element 32 couples the other terminal of the capacitance element 23 of the second-order integrator 100$_Q$ that is connected to the output terminal of the operational amplifier 10 to the other terminal of the capacitance element 23 of the second-order integrator 100$_I$ that is connected to the node 102 with no polarity inversion involved.

The coupling circuit 40 cross-couples the capacitance elements 22 of the second-order integrators 100$_I$ and 100$_Q$ together. Specifically, the coupling circuit 40 can be formed of resistance elements 41 and 42. The resistance element 41 couples one of the terminals of the capacitance element 22 of the second-order integrator 100$_I$ that is connected to the node 102 to one of the terminals of the capacitance element 22 of the second-order integrator 100$_Q$ that is connected to the inverted input terminal of the operational amplifier 10 with the polarity mutually inverted. The resistance element 42 couples the other terminal of the capacitance element 22 of the second-order integrator 100$_Q$ that is connected to the node 102 to the other terminal of the capacitance element 22 of the second-order integrator 100$_I$ that is connected to the inverted input terminal of the operational amplifier 10 with no polarity inversion involved.

In the complex second-order integrator 100 of this embodiment, when the resistance values of the resistance elements 11-14 are respectively $R_1$, $R_2$, $R_3$, and $R_4$, the capacitance values of the capacitance elements 21-23 are $C_1$, $C_2$, and $C_3$, the resistance values of the resistance elements 31 and 32 are $R_{f1}$, the resistance values of the resistance elements 41 and 42 are $R_{f2}$, the voltages at the nodes 101 and 102 in the second-order integrator 100$_I$ are $V_1$ and $V_2$, and the voltages at the nodes 101 and 102 in the second-order integrator 100$_Q$ are $V_3$ and $V_4$, the following nodal equations are satisfied.

$$\begin{cases} \frac{(V_1 - V_{inI})}{R_1} + \frac{V_1}{R_2} + V_1 \cdot sC_1 + \frac{V_1}{R_4} = 0 \\ -\frac{V_1}{R_2} - V_2 \cdot sC_2 - \frac{V_4}{R_{f2}} = 0 \\ V_2 \cdot sC_2 + \frac{V_2}{R_3} + (V_2 - V_{outI}) \cdot sC_3 + \frac{(V_2 - V_{outQ})}{R_f} + \frac{V_2}{R_{f2}} = 0 \\ \frac{(V_3 - V_{inQ})}{R_1} + \frac{V_3}{R_2} + V_3 \cdot sC_1 + \frac{V_3}{R_4} = 0 \\ -\frac{V_3}{R_2} - V_4 \cdot sC_2 + \frac{V_2}{R_{f2}} = 0 \\ V_4 \cdot sC_2 + \frac{V_4}{R_3} + (V_4 - V_{outQ}) \cdot sC_3 + \frac{(V_4 + V_{outI})}{R_f} + \frac{V_4}{R_{f2}} = 0 \end{cases}$$

where "s" is a Laplace operator.

Assuming that, in each of the second-order integrators 100$_I$ and 100$_Q$, the overall admittance where the elements connected to the node 101 are in parallel connection is equal to the overall admittance where the elements connected to the node 102 are in parallel connection, e.g., $C_1=C_2+C_3$, $1/R_3=1/R_1+1/R_2$, and $1/R_4=1/R_{f1}+1/R_{f2}$, the following transfer function is derived for the complex second-order integrator 100.

$$\frac{V_{outI} + jV_{outQ}}{V_{inI} + jV_{inQ}} = -\frac{R_{f1}R_{f2}}{(sC_2R_{f2} - j)(sC_3R_{f1} - j)R_1R_2}$$

$$= \frac{1}{\left(s - \frac{j}{C_2R_{f2}}\right)\left(s - \frac{j}{C_3R_{f1}}\right)R_1R_2C_2C_3}$$

As is evident from the above transfer function, the frequency characteristic of the complex second-order integrator 100 shifts in the positive direction by $1/C_2R_{f2}$ and $1/C_3R_{f1}$. In other words, the complex second-order integrator 100 has a transfer characteristic asymmetric with respect to the positive and negative frequencies, and exhibits a complex integral characteristic equivalent to the conventional complex second-order integrator that uses operational amplifiers heavily.

(Second Embodiment)

Figure 2:
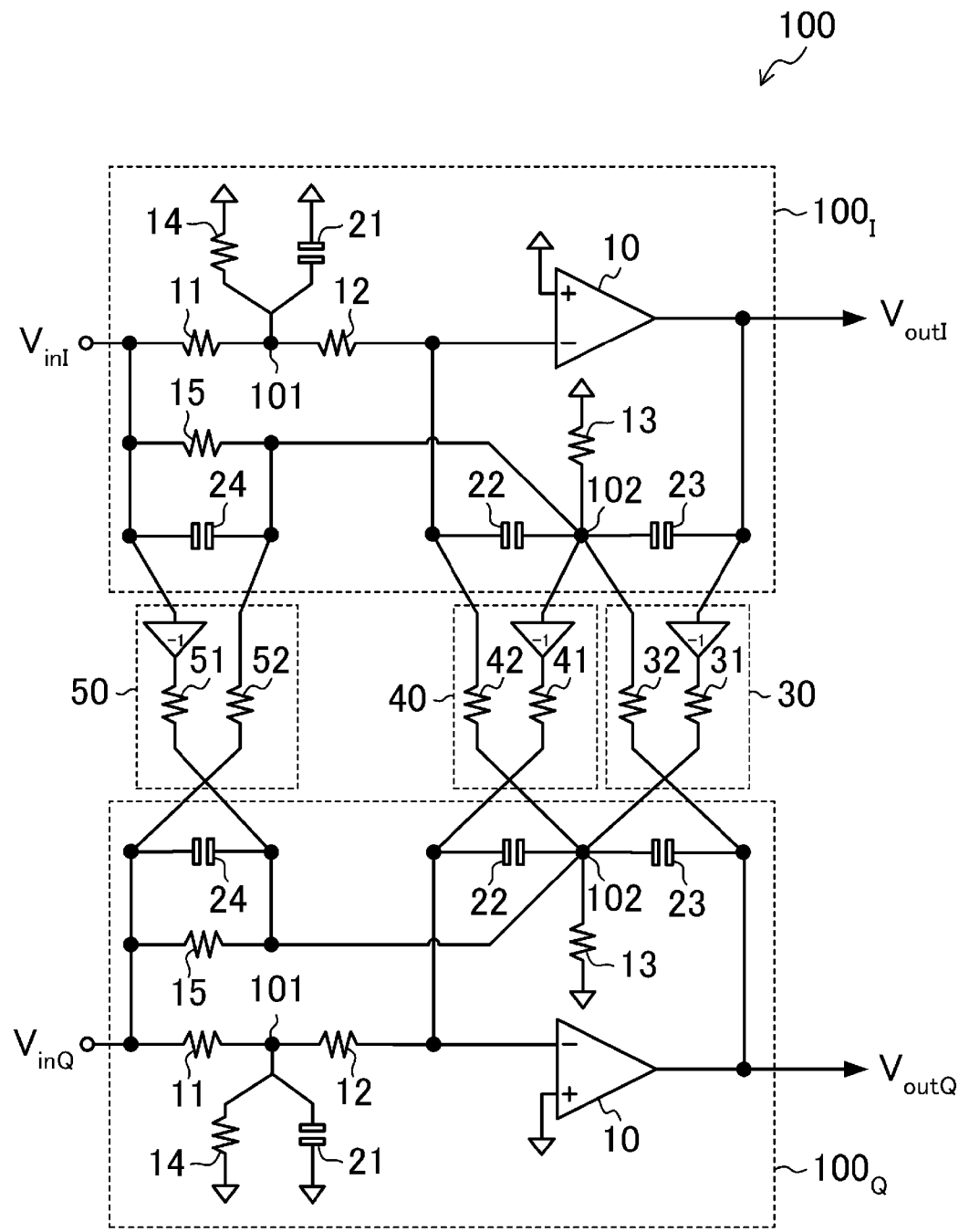
FIG. 2 is a block diagram of a complex second-order integrator of a second embodiment.

FIG. 2 shows a configuration of a complex second-order integrator of the second embodiment. A complex second-order integrator 100 of this embodiment includes the following in addition to the components of the complex second-order integrator 100 of FIG. 1. In each of the second-order integrators 100$_I$ and 100$_Q$, a resistance element 15 and a capacitance element 24 are connected in parallel between the node 102 and the signal input terminal. In addition, a coupling circuit 50 is provided, which cross-couples the capacitance elements 24 of the second-order integrators 100$_I$ and 100$_Q$ together. A difference from the first embodiment will be described hereinafter.

The coupling circuit 50 can be formed of resistance elements 51 and 52. The resistance element 51 couples one of the two terminals of the capacitance element 24 of the second-order integrator 100$_I$ that is connected to the signal input terminal to one of the two terminals of the capacitance element 24 of the second-order integrator 100$_Q$ that is connected to the node 102 with the polarity mutually inverted. The resistance element 52 couples the other terminal of the capacitance element 24 of the second-order integrator 100$_Q$ that is connected to the signal input terminal to the other terminal of the capacitance element 24 of the second-order integrator 100$_I$ that is connected to the node 102 with no polarity inversion involved.

In the complex second-order integrator 100 of this embodiment, when the resistance value of the resistance element 15 is $R_5$, the capacitance value of the capacitance element 24 is $C_4$, and the resistance values of the resistance elements 51 and 52 are $R_{f3}$ additionally, the following nodal equations are satisfied.

nected to the node 101 are in parallel connection is equal to the overall admittance where the elements connected to the node 102 are in parallel connection, e.g., $C_1=C_2+C_3+C_4$, $1/R_3=1/R_1+1/R_2$, and $1/R_4=1/R_{f1}+1/R_{f2}+1/R_{f3}+1/R_5$, and moreover assuming that $R_{f2}=C_3/C_2 \times R_{f1}$, $R_{f3}=C_3/C_4 \times R_{f1}$, for simplicity, the following transfer function is derived for the complex second-order integrator 100.

$$\frac{V_{outI} + jV_{outQ}}{V_{inI} + jV_{inQ}} =$$

$$\frac{-\left\{\frac{C_4}{C_3} \cdot \left(s - \frac{j}{C_3R_{f1}}\right)^2 + \frac{1}{C_3R_5} \cdot \left(s - \frac{j}{C_3R_{f1}}\right) + \frac{1}{R_1R_2C_2C_3}\right\}}{\left(s - \frac{j}{C_3R_{f1}}\right)^2}$$

As is evident from the above transfer function, the frequency characteristic of the complex second-order integrator 100 is equal to that obtained by shifting the following transfer function H(s) of a general second-order integrator by $1/C_3R_{f1}$ in the positive direction.

$$H(s) = \frac{-\left\{\frac{C_4}{C_3} \cdot s^2 + \frac{s}{C_3R_5} + \frac{1}{R_1R_2C_2C_3}\right\}}{s^2}$$

In other words, the complex second-order integrator 100 has a transfer characteristic asymmetric with respect to the positive and negative frequencies, and exhibits a complex integral characteristic equivalent to the conventional complex second-order integrator that uses operational amplifiers heavily. Moreover, the terms of the numerator of the transfer function can be changed freely and independently from one another. For example, only the second-order term can be changed by changing the capacitance value $C_4$, only the first-order term can be changed by changing the resistance value $R_5$, and only the zero-order term can be changed by changing any one of the resistance values $R_1$ and $R_2$ and the capacitance value $C_2$.

Note that the complex second-order integrators 100 of the first and second embodiments can be transformed into complex second-order resonators by providing a resistive path between the node 101 and the output terminal of the operational amplifier 10 in each of the second-order integrators 100$_I$ and 100$_Q$. Note however that, since the complex second- $$\begin{cases} \frac{(V_1 - V_{inI})}{R_1} + \frac{V_1}{R_2} + V_1 \cdot sC_1 + \frac{V_1}{R_4} = 0 \\ -\frac{V_1}{R_2} - V_2 \cdot sC_2 - \frac{V_4}{R_{f2}} = 0 \\ V_2 \cdot sC_2 + \frac{V_2}{R_3} + (V_2 - V_{outI}) \cdot sC_3 + \frac{(V_2 - V_{outQ})}{R_{f1}} + \frac{V_2}{R_{f2}} + (V_2 - V_{inI}) \cdot \left(\frac{1}{R_5} + sC_4\right) + \frac{(V_2 - V_{inQ})}{R_{f3}} = 0 \\ \frac{(V_3 - V_{inQ})}{R_1} + \frac{V_3}{R_2} + V_3 \cdot sC_1 + \frac{V_3}{R_4} = 0 \\ -\frac{V_3}{R_2} - V_4 \cdot sC_2 + \frac{V_2}{R_{f2}} = 0 \\ V_4 \cdot sC_2 + \frac{V_4}{R_3} + (V_4 - V_{outQ}) \cdot sC_3 + \frac{(V_4 + V_{outI})}{R_f} + \frac{V_4}{R_{f2}} + (V_4 - V_{inQ}) \cdot \left(\frac{1}{R_5} + sC_4\right) + \frac{(V_4 + V_{inI})}{R_{f3}} = 0 \end{cases}$$

Assuming that, in each of the second-order integrators 100$_I$ and 100$_Q$, the overall admittance where the elements conorder integrator 100 virtually acts as a resonator by setting the element values so that the overall admittance where the elements connected to the node 101 are in parallel connection is equal to the overall admittance where the elements connected to the node 102 are in parallel connection, it is unnecessary to take the trouble to provide a resistive path.

(Third Embodiment)

Figure 3:
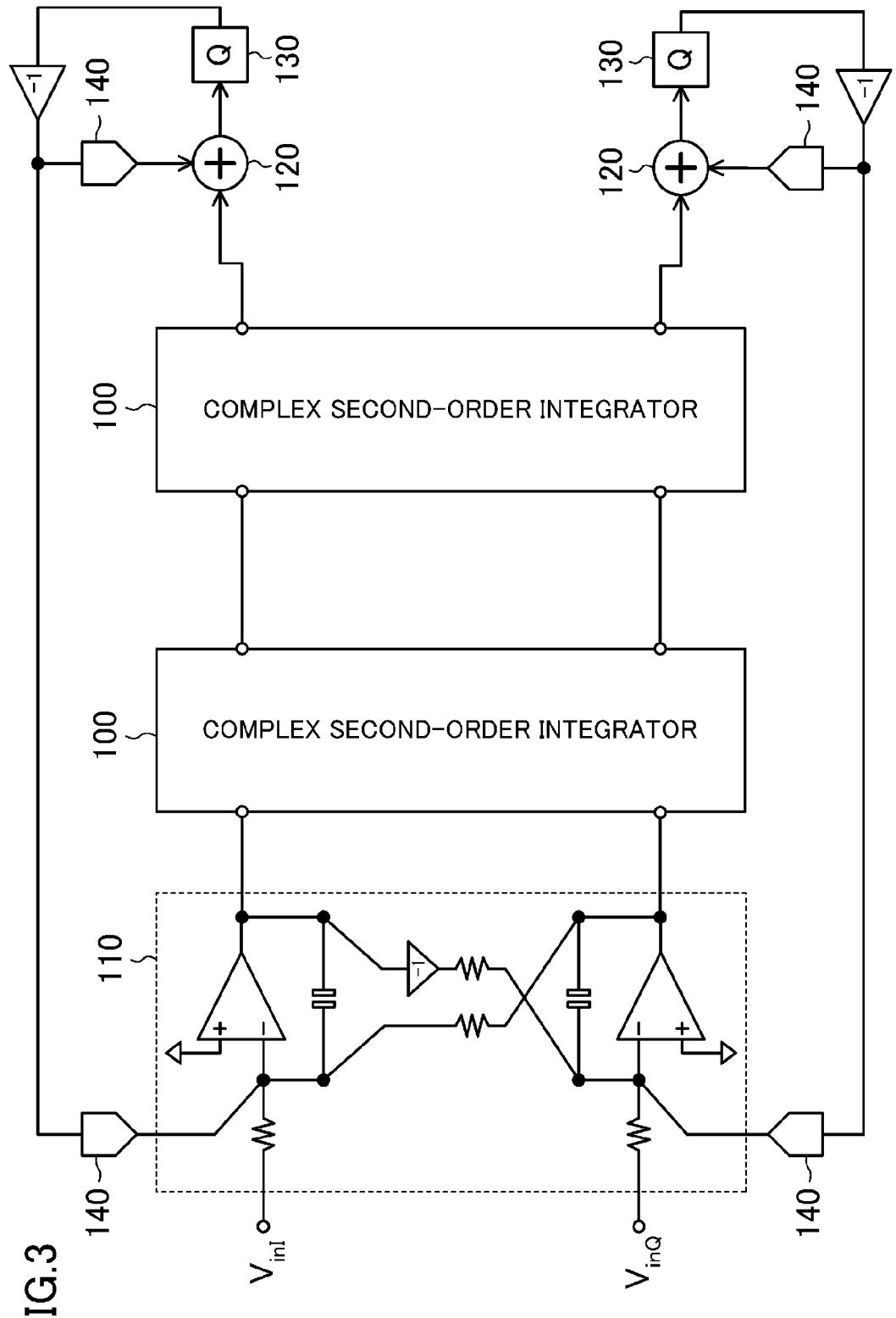
FIG. 3 is a block diagram of an oversampling A/D converter of a third embodiment.
Figure 4:
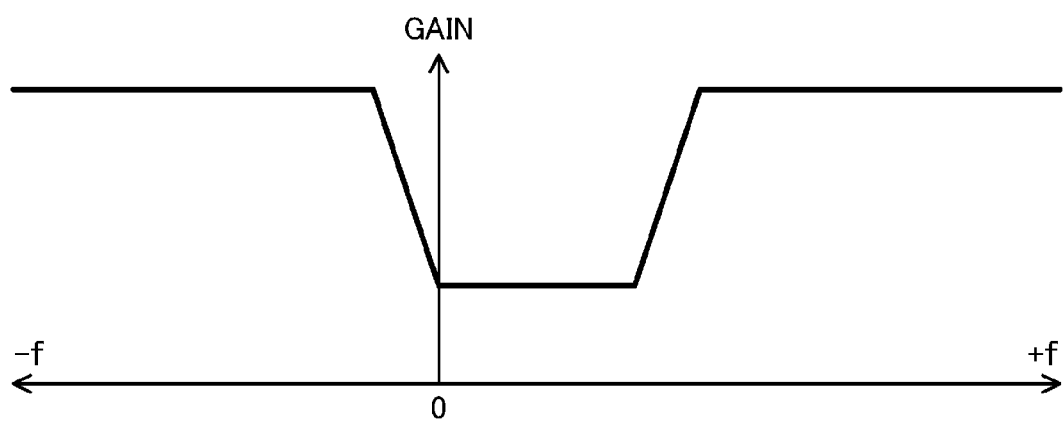
FIG. 4 is a graph showing a quantization noise transfer characteristic of the oversampling A/D converter of FIG. 3.

FIG. 3 shows a configuration of a CTDS-ADC of the third embodiment. In FIG. 3, the reference character 110 denotes a general complex first-order integrator, 120 denotes an adder, 130 denotes a quantizer, and 140 denotes D/A converters (voltage-current converters). Each of complex second-order integrators 100 may be the one of the first embodiment or the second embodiment. By the cascade connection of the complex first-order integrator 110 and the two complex second-order integrators 100, the CTDS-ADC of this embodiment exhibits the fifth-order complex integral characteristic. FIG. 4 shows a quantization noise transfer characteristic of the CTDS-ADC of this embodiment. The CTDS-ADC of this embodiment has an asymmetric transfer characteristic shifted in the positive direction. Thus, in this embodiment, a CTDS-ADC having a high-order complex integral characteristic can be implemented with a reduced number of operational amplifiers.

What is claimed is:

1. A complex second-order integrator, comprising:
   first and second second-order integrators; and
   first and second coupling circuits configured to couple the first and second second-order integrators together,
   wherein
   each of the first and second second-order integrators includes
      an operational amplifier,
      a first resistance element connected between a first node and a signal input terminal of the second-order integrator,
      a second resistance element connected between the first node and an inverted input terminal of the operational amplifier,
      a first capacitance element connected between the first node and a ground,
      a second capacitance element connected between a second node and the inverted input terminal of the operational amplifier,
      a third capacitance element connected between the second node and an output terminal of the operational amplifier,
      a third resistance element connected between the second node and the ground, and
      a fourth resistance element connected between the first node and the ground,
   the first coupling circuit includes
      a fifth resistance element configured to couple the output terminal of the operational amplifier of the first second-order integrator to the second node in the second second-order integrator with the polarity mutually inverted, and
      a sixth resistance element configured to couple the output terminal of the operational amplifier of the second second-order integrator to the second node in the first second-order integrator with no polarity inversion involved, and
   the second coupling circuit includes
      a seventh resistance element configured to couple the inverted input terminal of the operational amplifier of the second second-order integrator to the second node in the first second-order integrator with the polarity mutually inverted, and
      an eighth resistance element configured to couple the inverted input terminal of the operational amplifier of the first second-order integrator to the second node in the second second-order integrator with no polarity inversion involved.

2. The complex second-order integrator of claim 1, wherein
   an overall admittance where elements connected to the first node are in parallel connection is equal to an overall admittance where elements connected to the second node are in parallel connection.

3. An oversampling A/D converter comprising the complex second-order integrator of claim 2.

4. The complex second-order integrator of claim 1, further comprising:
   a third coupling circuit configured to couple the first and second second-order integrators together,
   wherein
   each of the first and second second-order integrators includes
      a fourth capacitance element connected between the second node and the signal input terminal of the second-order integrator, and
      a ninth resistance element connected between the second node and the signal input terminal of the second-order integrator, and
   the third coupling circuit includes
      a tenth resistance element configured to couple the signal input terminal of the first second-order integrator to the second node in the second second-order integrator with the polarity mutually inverted, and
      an eleventh resistance element configured to couple the signal input terminal of the second second-order integrator to the second node in the first second-order integrator with no polarity inversion involved.

5. The complex second-order integrator of claim 4, wherein
   an overall admittance where elements connected to the first node are in parallel connection is equal to an overall admittance where elements connected to the second node are in parallel connection.

6. An oversampling A/D converter comprising the complex second-order integrator of claim 5.

7. An oversampling A/D converter comprising the complex second-order integrator of claim 4.

8. An oversampling A/D converter comprising the complex second-order integrator of claim 1.

* * * * *